United States Patent

Cowles et al.

[11] Patent Number: 5,945,840
[45] Date of Patent: *Aug. 31, 1999

[54] LOW CURRENT REDUNDANCY ANTI-FUSE ASSEMBLY

[75] Inventors: Timothy B. Cowles; Steven G. Renfro, both of Boise, Id.

[73] Assignee: Micron Technology, Inc., Boise, Id.

[*] Notice: This patent is subject to a terminal disclaimer.

[21] Appl. No.: 08/879,983

[22] Filed: Jun. 20, 1997

Related U.S. Application Data

[63] Continuation-in-part of application No. 08/631,449, Apr. 12, 1996, Pat. No. 5,663,658, which is a continuation of application No. 08/452,203, May 26, 1995, Pat. No. 5,508,638, which is a continuation of application No. 08/201,432, Feb. 24, 1994, Pat. No. 5,424,672.

[51] Int. Cl.$^6$ ........................ H03K 19/003; H03K 19/173
[52] U.S. Cl. ............................. 326/38; 326/10; 327/525; 365/230.01
[58] Field of Search ........................ 326/10, 38; 327/525; 365/230.01

[56] References Cited

U.S. PATENT DOCUMENTS

| | | |
|---|---|---|
| 3,721,838 | 3/1973 | Brickman et al. . |
| 4,689,494 | 8/1987 | Chen et al. . |
| 4,791,319 | 12/1988 | Tagami et al. . |
| 4,847,810 | 7/1989 | Tagami . |
| 5,059,835 | 10/1991 | Lauffer et al. . |
| 5,099,149 | 3/1992 | Smith . |
| 5,301,143 | 4/1994 | Ohri et al. . |
| 5,301,159 | 4/1994 | Lee . |
| 5,424,672 | 6/1995 | Cowles et al. . |
| 5,446,695 | 8/1995 | Douse et al. . |
| 5,457,659 | 10/1995 | Schaefer . |
| 5,485,031 | 1/1996 | Zhang et al. . |
| 5,485,032 | 1/1996 | Schepis et al. . |
| 5,486,707 | 1/1996 | Look et al. . |
| 5,486,776 | 1/1996 | Chiang . |
| 5,495,181 | 2/1996 | Kolze . |
| 5,495,436 | 2/1996 | Callahan . |
| 5,498,895 | 3/1996 | Chen . |
| 5,502,000 | 3/1996 | Look et al. . |
| 5,502,333 | 3/1996 | Bertin et al. . |
| 5,502,668 | 3/1996 | Shimoji et al. . |
| 5,502,674 | 3/1996 | Griffus et al. . |
| 5,506,518 | 4/1996 | Chiang . |
| 5,508,638 | 4/1996 | Cowles et al. . |

Primary Examiner—Michael Tokar
Assistant Examiner—Richard Roseen
Attorney, Agent, or Firm—Trask, Britt, & Rossa

[57] ABSTRACT

An inventive programmable circuit stores a bit (i.e., a "1" or a "0") as the result of one of a pair of anti-fuses of the circuit connected in series between a supply voltage $V_{cc}$ and ground $V_{ss}$ being blown. If the anti-fuse connected to the supply voltage $V_{cc}$ is blown, the supply voltage $V_{cc}$ passes through the anti-fuse to a node between the series-connected anti-fuses. If, instead, the anti-fuse connected to ground $V_{ss}$ is blown, the node between the anti-fuses is connected to ground through the blown anti-fuse. The voltage on the node (i.e., $V_{cc}$ or $V_{ss}$) may then be output from the programmable circuit as being representative of the bit stored in the circuit. Because only one of the anti-fuses is blown, no direct path exists between the supply voltage $V_{cc}$ and ground $V_{ss}$, so the programmable circuit does not waste current as prior circuits are known to do. The programmable circuit is particularly useful in storing the memory addresses of memory cells in a memory device that are to be replaced by redundant cells.

18 Claims, 5 Drawing Sheets

LOW CURRENT REDUNDANCY ANTI-FUSE ASSEMBLY

This is a continuation-in-part of application Ser. No. 08/631,449, filed Apr. 12, 1996, now U.S. Pat. No. 5,663,658; which is a continuation of application Ser. No. 08/452,203, filed May 26, 1995, now U.S. Pat. No. 5,508,638; which is a continuation of application Ser. No. 08/201,432, filed Feb. 24, 1994, now U.S. Pat. No. 5,424,672.

BACKGROUND OF THE INVENTION

1. Field of the Invention

This invention relates in general to the testing of microelectronic modules, and more specifically to the use of anti-fuse-controlled enabling or disabling logic circuits, such as the ones used to disable a portion of a memory array found to be defective during wafer-level testing.

2. State of the Art

Semiconductor integrated circuits contain large numbers of electronic components, such as diodes and transistors, built on a single chip. Due to the microscopic scale of these circuits, they are susceptible to component defects due to material impurities and fabrication hazards.

In order to circumvent this problem, redundant components and circuits are built on most chips that can be switched-in in lieu of corresponding circuits found defective during testing. Usually the switching-out of a defective component or circuit, and the switching-in of a corresponding redundant element, is accomplished by using programmable logic circuits which are activated by blowing certain fuses or anti-fuses built into the chip circuitry.

Figure 1:
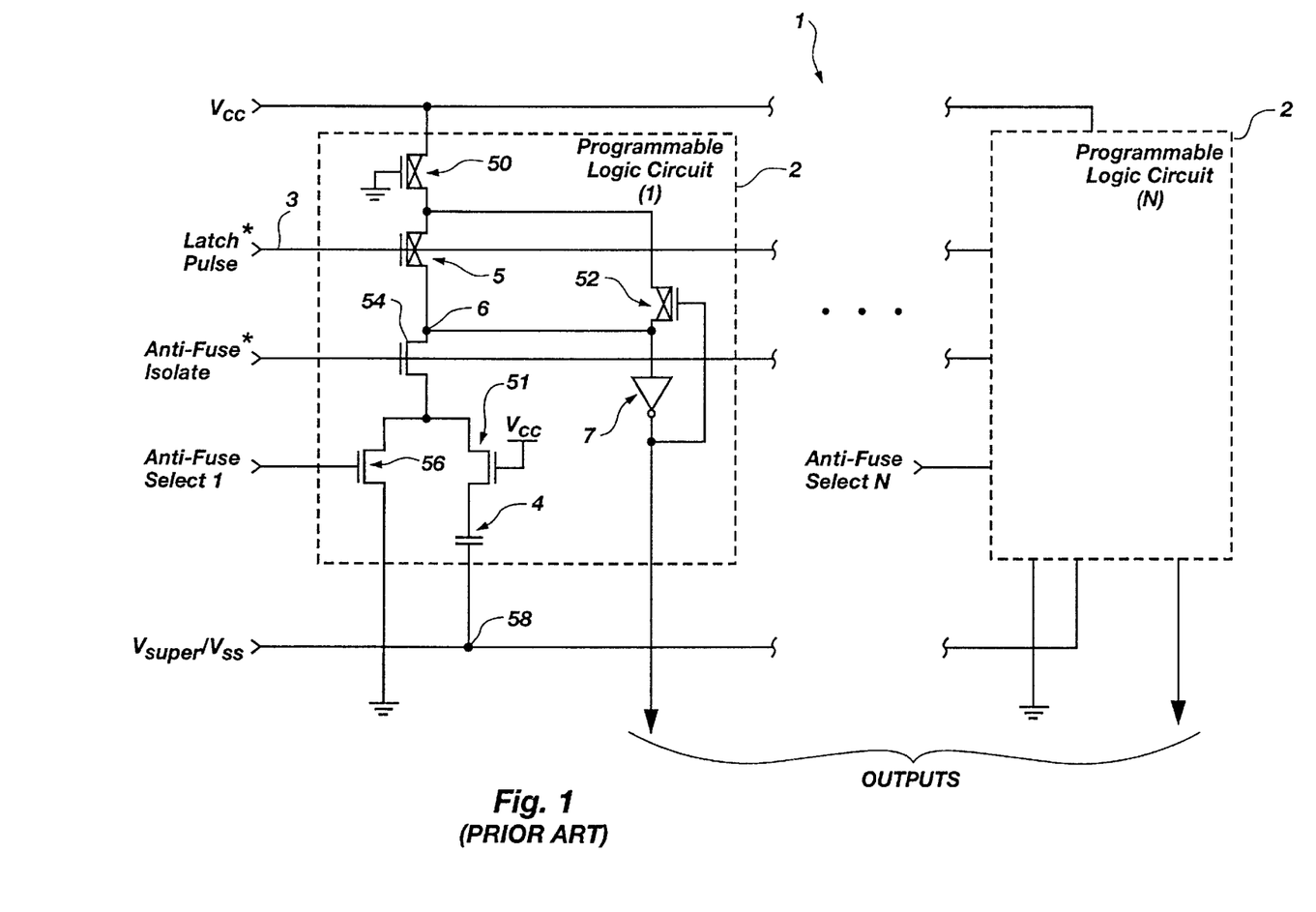
FIG. 1 illustrates a conventional bank of programmable logic circuits for routing a latching pulse.

FIG. 1 illustrates an anti-fuse-controlled programmable circuit.

A bank 1 of N programmable logic circuits 2 is interrogated by a Latch_Pulse* appearing on a latch pulse line 3 connected to control terminals of the logic circuits 2. Each programmable logic circuit 2 comprises an anti-fuse 4 wired in series with a switching transistor 5 and load transistors 50 and 51 between a supply voltage $V_{cc}$ and its ground reference $V_{ss}$. A node 6 between the anti-fuse 4 and the switching transistor 5 is wired into the input of a driver 7. The output of the driver 7 is typically used to set a latching circuit (not shown) which disables a defective circuit (not shown) and enables a substitute from a redundant circuit bank (not shown). A hysteresis transistor 52 reinforces the output of a low from the driver 7 when the node 6 is high.

Each programmable logic circuit 2 may be programmed by first providing a low Anti-Fuse_Isolate* signal to the circuit 2, thereby turning off an isolation transistor 54 and isolating the anti-fuse 4 from the node 6. The programmable logic circuit 2 to be programmed then receives a high Anti-Fuse_Select signal, causing an anti-fuse select transistor 56 to turn on in order to couple one terminal of the anti-fuse 4 to ground. A Super Voltage $V_{SUPER}$ momentarily applied to the other terminal 58 of the anti-fuse 4 then "blows" the anti-fuse 4.

For normal operations, the Anti-Fuse_Isolate* signal goes high to turn the isolation transistor 54 on and thereby couple the anti-fuse 4 to the node 6, the Anti-Fuse_Select signal goes low to turn off the anti-fuse select transistor 56, and the ground reference voltage $V_{ss}$ replaces the Super Voltage $V_{SUPER}$ at the terminal 58 of the anti-fuse 4.

During normal operations, the Latch_Pulse* is allowed to pass through the programmable logic circuit 2 only if the ant-fuse 4 has been blown. So long as the anti-fuse 4 isolates the node 6 from the reference ground $V_{ss}$, the output of the driver 7 remains low regardless of the presence of the Latch_Pulse* on its control terminal, because the hysteresis transistor 52 keeps the input to the driver 7 high, thus maintaining the output of the driver 7 low.

It should be noted that, during normal operations, when the anti-fuse 4 is blown, current is drawn through the load transistor 50, the switching transistor 5, the isolation transistor 54, the load transistor 51, and the blown anti-fuse 4 during the active period of every Latch_Pulse*. This type of programmable logic circuit is commonly used in connection with memory chips wherein a Latch_Pulse* is usually issued with every memory cycle. As more programmable logic circuits of this type are placed on a wafer and are programmed by blowing their anti-fuses, the cumulative current drawn with every Latch_Pulse* can be significant and, obviously, undesirable.

A common solution to this problem is to pulse the programmable logic circuit, i.e., issue a Latch_Pulse* only once upon powering up the chip in order to latch-in the proper redundancy scheme or other control option. However, pulsing the circuits during the power up cycle does not guarantee that the proper redundancy or other option then set will not be unlatched sometime later during the operation of the chip as a result of a power surge, background noise or other form of transient. Without any other pulsing of the programmable logic circuit until the next power up, there is no way the circuit can correct itself in such cases of spurious unlatching. Moreover, there is never any guarantee that the correct program can be latched-in with one single initial pulse. It is therefore preferable to issue a Latch_Pulse* with every memory cycle, or multiples thereof, to assure not only a correct original latching-in of the programmable scheme, but also an automatic correction of any spurious malfunction.

Accordingly, there is a need in the art for a solution to the excessive drawing of current by banks of such programmable logic circuits used to latch-in redundancy circuits and other programmable options.

SUMMARY OF THE INVENTION

A programmable circuit in accordance with the present invention solves the problem described above by outputting a programmed logic signal, such as a bit of a programmed memory address, from a node between two anti-fuses, one of which is "blown," coupled between a high voltage (e.g., $V_{cc}$) and a low voltage (e.g., $V_{ss}$). As a result, the high voltage ($V_{cc}$) or the low voltage ($V_{ss}$) may pass through the blown anti-fuse to the node, and to the input of an output driver (e.g., an inverter) coupled to the node, without current wastefully flowing through either of the anti-fuses to ground.

Specifically, the inventive programmable circuit includes the anti-fuses connected in series with at least one "current conduit"—typically a transistor controlled by a latch pulse signal—between first and second voltages (e.g., $V_{cc}$ and $V_{ss}$) respectively associated with first and second logic states (e.g., a "1" state and a "0" state). The anti-fuses are programmable to alter current flow through themselves so the node between the anti-fuses is programmably coupleable to the first and second voltages for outputting the logic signal in the first and second logic states, respectively.

In other embodiments of the present invention, one or more of the programmable circuits described above are incorporated into a logic circuit, an integrated circuit die, an integrated circuit package, a redundant memory system, a computer system, and a semiconductor wafer.

Another embodiment is directed to a method of programming a memory device to generate a programmed address in response to a latch signal for comparison to memory addresses received by the memory device from external circuitry. Such a method is useful in determining if redundant elements in the memory device should be accessed in lieu of accessing primary memory elements identified by the received memory addresses. In the method, at least two enabling anti-fuses and at least one enabling switch are provided coupled in series between a supply voltage $V_{cc}$ and a reference voltage $V_{ss}$. The enabling switch is responsive to the latch signal. The enabling anti-fuses are programmed to allow only one of the supply and reference voltages $V_{cc}$ and $V_{ss}$ to be conducted to an enabling node between the anti-fuses when the latch signal activates the enabling switch. At least two output anti-fuses and at least one control switch are provided coupled in series between the supply and reference voltages $V_{cc}$ and $V_{ss}$ for each bit in the address to be programmed, with the control switch being responsive to the voltage at the enabling node. The output anti-fuses associated with each bit in the programmed address have an output node between them for outputting their associated bit. The output anti-fuses associated with each bit in the address to be programmed are programmed to allow conduction of only one of the supply and reference voltages $V_{cc}$ and $V_{ss}$ to their associated output node in order to output the programmed address when the voltage on the enabling node activates the control switches.

In a further embodiment, a method for accessing a redundant cell of a memory device in lieu of accessing a normal memory cell of the device includes receiving a latch signal and, in response, switchably coupling (as through a switching transistor) a first voltage to an enabling node. A corresponding enabling signal is then output from the node. At least one control switch associated with each bit in a programmed address associated with the normal memory cell is activated in response to the enabling signal, with each control switch being coupled in series with at least two anti-fuses between first and second voltages. One of the anti-fuses associated with each bit of the programmed address is pre-programmed to conduct the first or second voltage corresponding to its associated bit through itself. Each different bit in the programmed address is then output from an output node between the anti-fuses associated with the bit. Memory addresses corresponding to memory cells in the memory device are then received, and these memory addresses are compared to the programmed address. When a match occurs, a redundant cell in the memory device is accessed in lieu of accessing a primary memory cell identified by the received memory address that matches the programmed address.

DETAILED DESCRIPTION OF THE ILLUSTRATED EMBODIMENTS

Figure 2A:
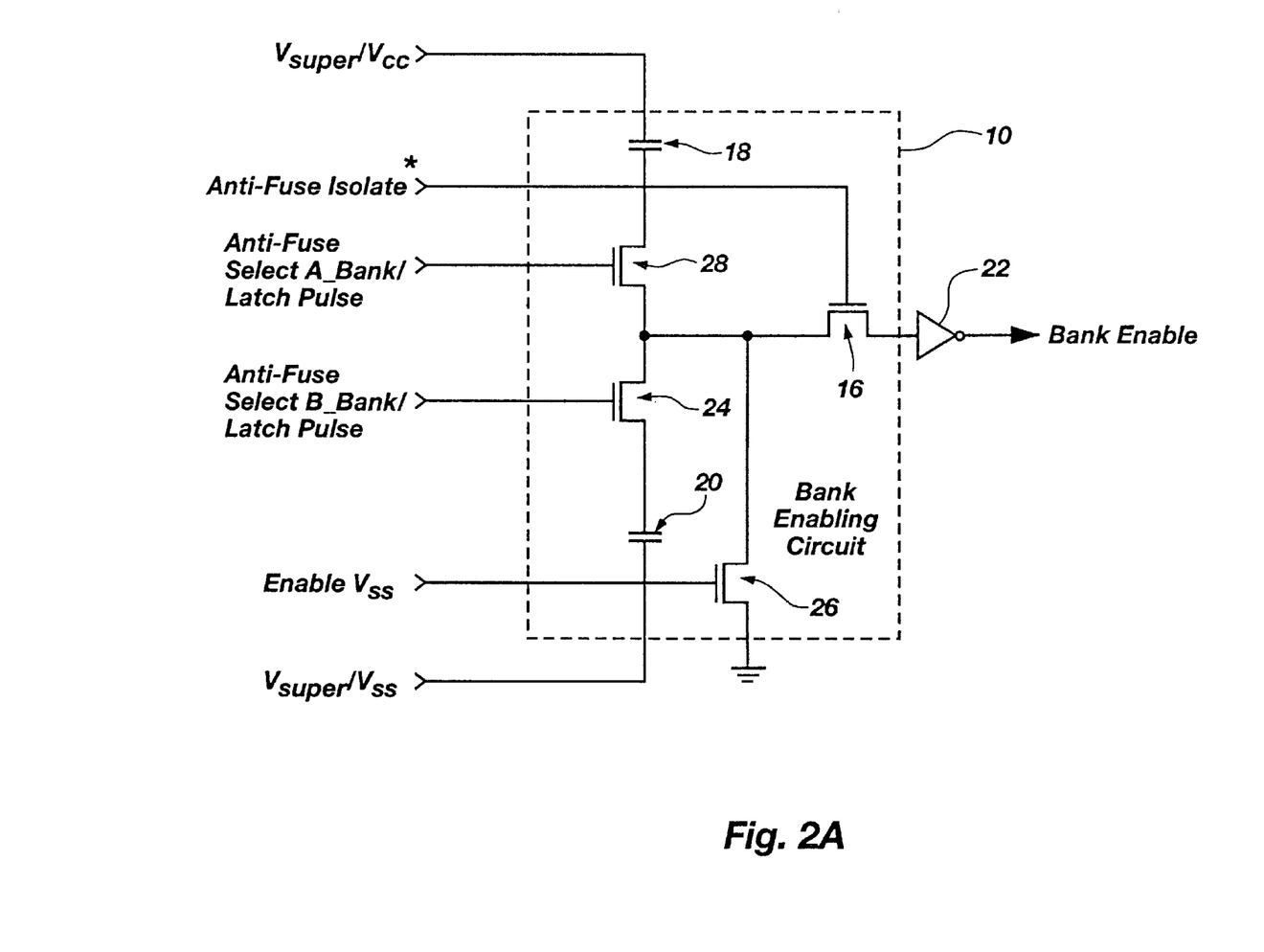
FIGS. 2A and 2B are schematics of a latching pulse-routing circuit according to the present invention.
Figure 2B:
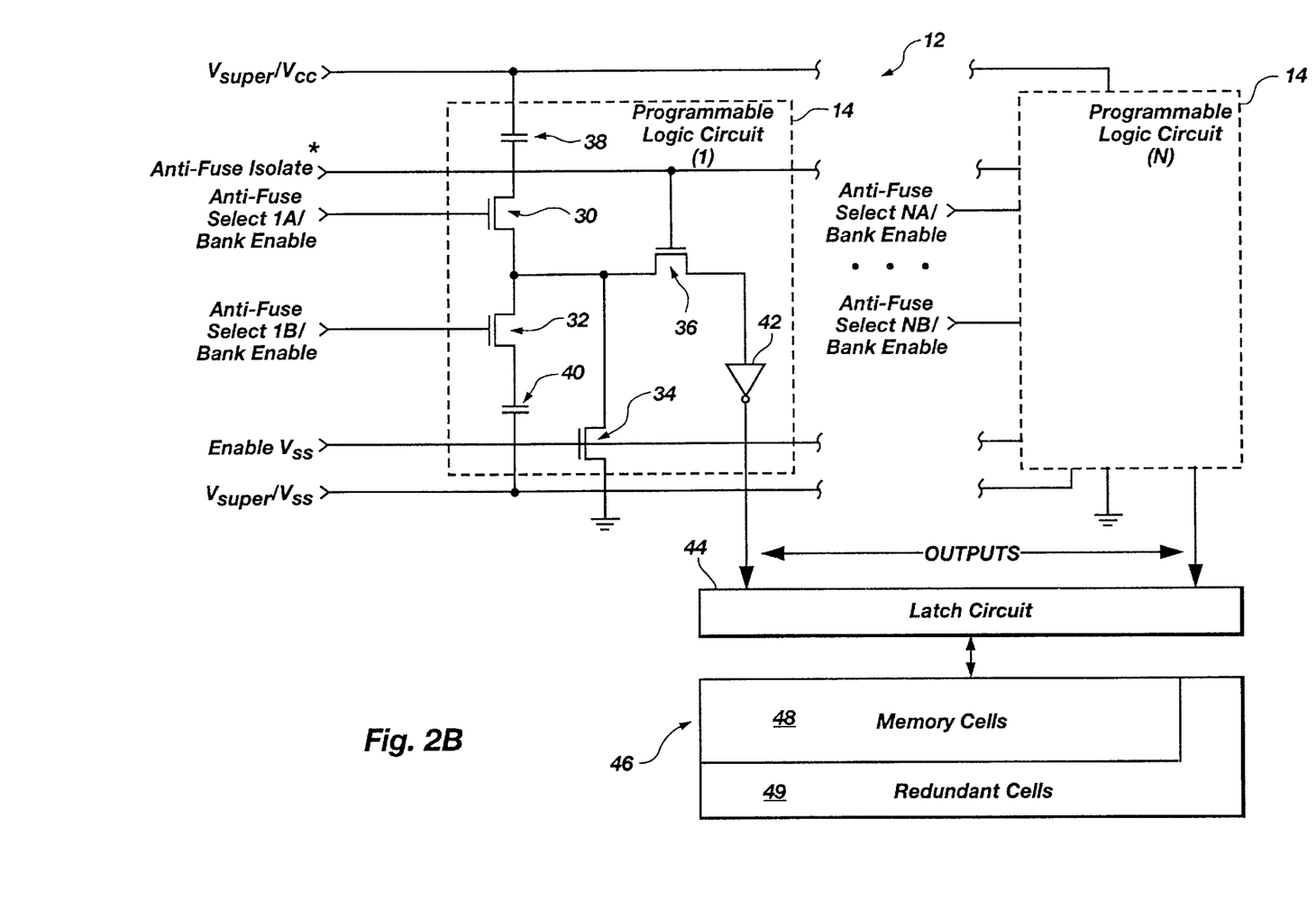

As shown in FIGS. 2A and 2B, a memory system in accordance with the present invention includes a bank enabling circuit 10 for enabling operation of a bank 12 of programmable circuits 14. It should be understood that FIGS. 2A and 2B may, for example, depict a schematic of the memory system as incorporated into an integrated circuit (IC) die or an IC package. It should also be understood that although only one (1) bank of programmable circuits, and only one (1) bank enabling circuit, is illustrated in FIGS. 2A and 2B, in practice multiple banks of programmable circuits and multiple bank enabling circuits are provided in the inventive memory system.

To program the bank enabling circuit 10 to enable the bank 12 of programmable circuits 14, a low Anti-Fuse__Isolate* signal turns off an isolation transistor 16, thereby isolating anti-fuses 18 and 20 from an output inverter 22. A high Anti-Fuse__Select__B__Bank signal then turns on a selection transistor 24, and a high Enable__$V_{ss}$ signal turns on an enable transistor 26, so one side of the anti-fuse 20 is coupled to ground through the transistors 24 and 26. A Super Voltage $V_{SUPER}$ applied to the other side of the anti-fuse 20 then blows the anti-fuse 20.

During normal operation, a high Anti-Fuse__Isolate* signal turns the isolation transistor 16 on, thereby connecting the output inverter 22 to the anti-fuse 20. A low Enable__$V_{ss}$ signal turns off the enable transistor 26. A high Latch__Pulse turns on the selection transistor 24, allowing ground reference $V_{ss}$ to pass through the blown anti-fuse 20 and the active selection and isolation transistors 24 and 16 to the input of the output inverter 22, causing the inverter 22 to output a high Bank__Enable signal which enables the bank 12 as discussed below.

In contrast, to program the bank enabling circuit 10 to disable the bank 12 of programmable circuits 14, a low Anti-Fuse__Isolate* signal turns off the isolation transistor 16, thereby isolating anti-fuses 18 and 20 from the output inverter 22. A high Anti-Fuse__Select__A__Bank signal then turns on a selection transistor 28, and a high Enable__$V_{ss}$ signal turns on the enable transistor 26, so one side of the anti-fuse 18 is coupled to ground through the transistors 28 and 26. A Super Voltage $V_{SUPER}$ applied to the other side of the anti-fuse 18 then blows the anti-fuse 18.

During normal operation, a high Anti-Fuse__Isolate* signal turns the isolation transistor 16 on, thereby connecting the output inverter 22 to the anti-fuse 18. A low Enable__$V_{ss}$ signal turns off the enable transistor 26. A high Latch__Pulse turns on the selection transistor 28, allowing a supply voltage $V_{cc}$ to pass through the blown anti-fuse 18 and the active selection and isolation transistors 28 and 16 to the input of the output inverter 22, causing the inverter 22 to output a low Bank__Enable signal which disables the bank 12.

Irregardless of whether the bank enabling circuit 10 is programmed to enable or disable the bank 12 of programmable circuits 14, it can be seen in FIG. 2A that no direct path ever exists between the supply voltage $V_{cc}$ and ground $V_{ss}$, because one of the anti-fuses 18 and 20 always remains un-blown. As a result, the excessive current problem described above is substantially reduced or eliminated.

Referring to FIG. 2B, each programmable circuit 14 is programmed with a bit (i.e., a "1" or a "0") of a memory address that is to be programmed into the bank 12 in a manner similar to the programming of the bank enabling circuit 10 of FIG. 2A described above. Namely, the Anti-Fuse__Isolate*, Anti-Fuse__Select, and Enable__$V_{ss}$ signals are manipulated as necessary to operate selection transistors 30 and 32, an enable transistor 34, and an isolation transistor 36 in each circuit 14 to blow one of a pair of anti-fuses 38 and 40 in each circuit 14 with the Super Voltage $V_{SUPER}$.

In operation, the Anti-Fuse_Isolate* signal is high, thereby turning on the isolation transistor 36, and the Enable_$V_{ss}$ signal is low, thereby turning off the enable transistor 34. If a high Bank_Enable signal from the bank enable circuit 10 of FIG. 2A enables the bank 12 of programmable circuits 14, selection transistors 30 and 32 in each programmable circuit 14 turn on. If the anti-fuse 38 in a programmable circuit 14 has been blown, the supply voltage $V_{cc}$ passes through the blown anti-fuse 38 and the selection and isolation transistors 30 and 36 to the input of an output driver 42 of the circuit 14, causing the output driver 42 to output a low (e.g., a "0"). If, instead, the anti-fuse 40 of a programmable circuit 14 has been blown, the ground reference voltage $V_{ss}$ passes through the blown anti-fuse 40 and the selection and isolation transistors 32 and 36 to the input of the output driver 42, causing the output driver 42 to output a high (e.g., a "1").

It can be seen in FIG. 2B that because only one (1) of the anti-fuses 38 and 40 in each programmable circuit 14 is blown, no direct path exists from the supply voltage $V_{cc}$ to ground $V_{ss}$, so the problem of excessive current draw is substantially reduced or eliminated.

The bits output from the programmable circuits 14 are latched in by a latch circuit 44 and are then used in a memory array 46 to direct the replacement of memory cells 48 with redundant cells 49.

Figure 3:
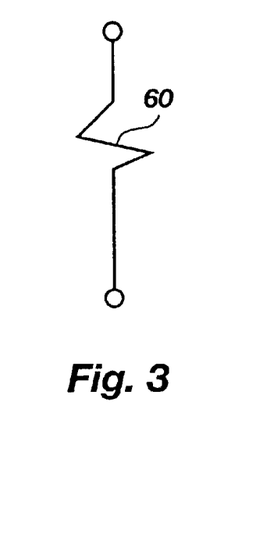
FIG. 3 is a schematic of a resistor for use as an alternative current conduit in the present invention.

As shown in FIG. 3, any one of the selection transistors 24, 28, 30, and 32 may be replaced with a resistor 60. Of course, it should be understood that current conduits other than the resistor 60 will also work to replace the selection transistors, including, for example, a resistance-connected transistor similar to the load transistor 50 shown in FIG. 1. Of course, control switches such as the transistors 24, 28, 30, and 32 are typically preferred in the present invention as current conduits.

Figure 4:
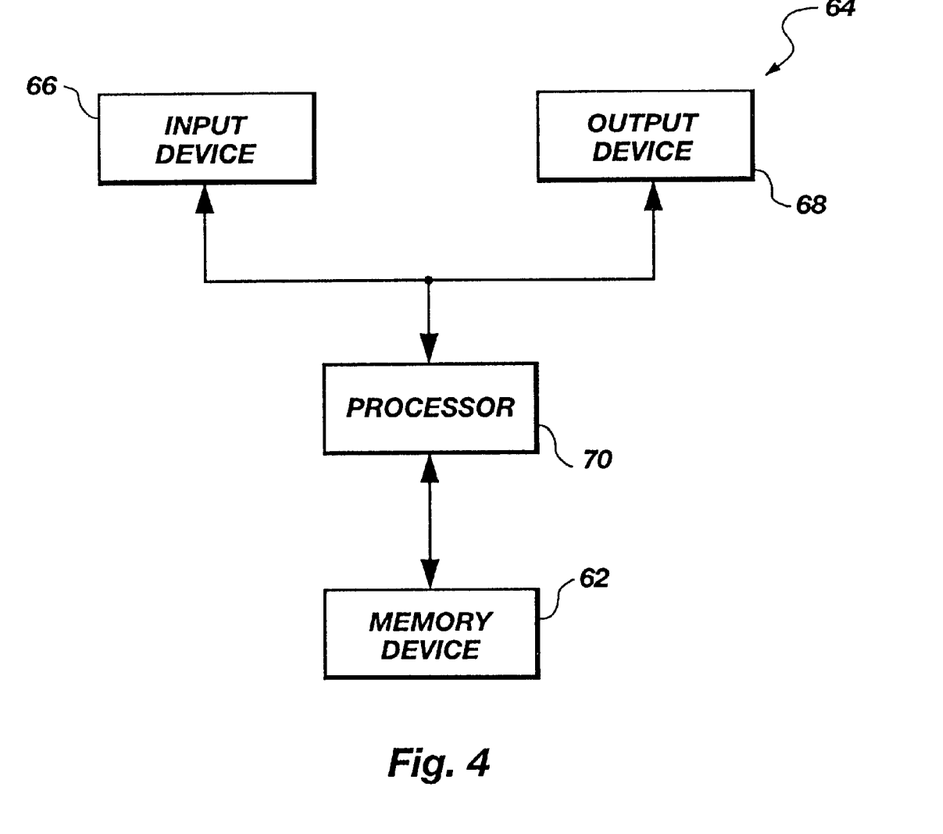
FIG. 4 is a block diagram of a computer system including the circuit of FIGS. 2A and 2B.
Figure 5:
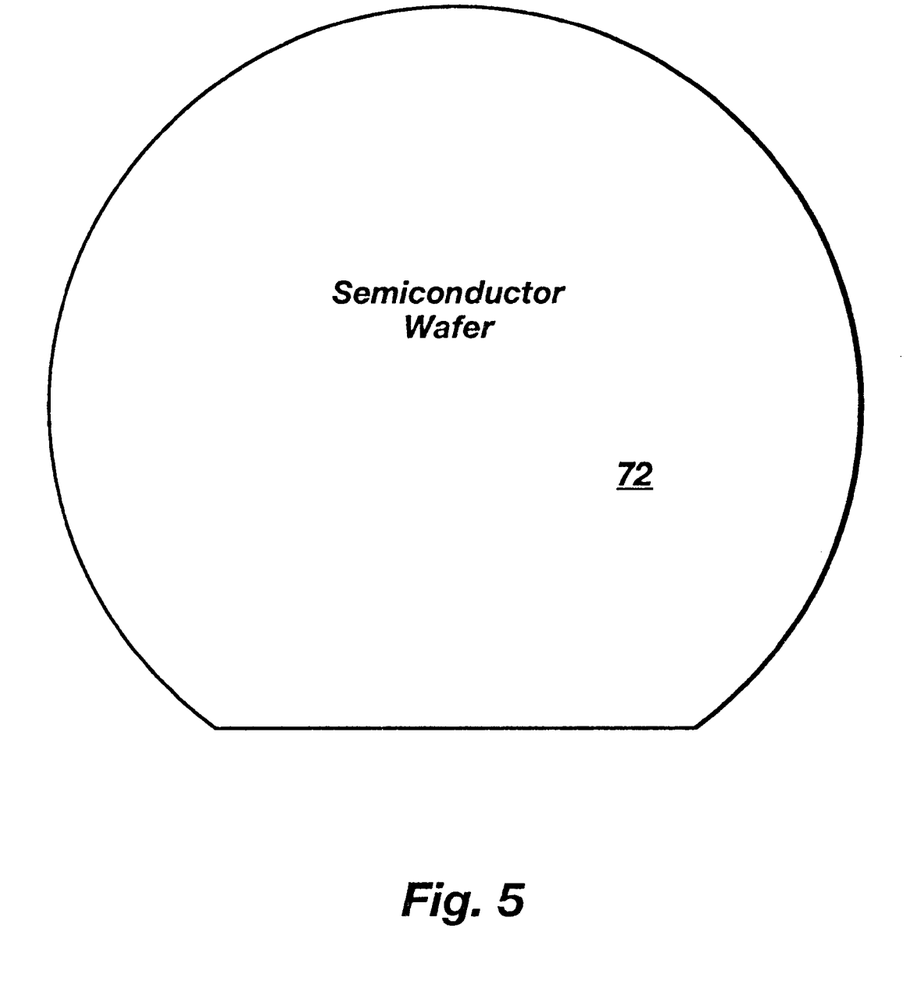
FIG. 5 is a plan view of a semiconductor wafer incorporating the circuit of FIGS. 2A and 2B.

As shown in FIG. 4, the bank enabling circuit 10 and bank 12 of FIGS. 2A and 2B may be incorporated into a memory device 62 of a computer system 64 that also includes an input device 66, an output device 68, and a processor 70. As shown in FIG. 5, the bank enabling circuit 10 and bank 12 of FIGS. 2A and 2B may be incorporated into a semiconductor wafer 72.

Although the present invention has been described with reference to particular embodiments, the invention is not limited to these described embodiments. Rather, the invention is limited only by the appended claims, which include within their scope all equivalent devices or methods which operate according to the principles of the invention as described.

We claim:

1. A programmable circuit for outputting a logic signal in a pre-determined logic state, the programmable circuit comprising at least two anti-fuses and at least one current conduit coupled in series between first and second voltages, the first voltage being associated with a first logic state and the second voltage being associated with a second logic state, the anti-fuses being programmable to alter current flow therethrough such that a node between the anti-fuses is programmably coupleable to the first voltage for outputting the logic signal in the first logic state and to the second voltage for outputting the logic signal in the second logic state.

2. The programmable circuit of claim 1 wherein the current conduit comprises a resistance circuit.

3. The programmable circuit of claim 2 wherein the resistance circuit is selected from a group comprising a resistor and a resistance-connected transistor.

4. The programmable circuit of claim 1 wherein the current conduit comprises a control switch.

5. The programmable circuit of claim 4 wherein the control switch comprises a transistor.

6. The programmable circuit of claim 1 wherein one of the first and second voltages comprises a reference voltage and the other of the first and second voltages comprises a supply voltage.

7. The programmable circuit of claim 6 wherein the reference voltage comprises ground.

8. The programmable circuit of claim 1 wherein one of the first and second logic states comprises a logic "0" state and the other of the first and second logic states comprises a logic "1" state.

9. A logic circuit for outputting a logic signal in a pre-determined logic state in response to a latch signal, the logic circuit comprising:

an enabling circuit comprising at least one enabling switch and at least two enabling anti-fuses coupled in series between a supply voltage and a reference voltage, the supply voltage being associated with a first logic state and the reference voltage being associated with a second logic state, the at least one enabling switch being constructed to receive the latch signal and to respond thereto, the enabling anti-fuses being programmable to alter current flow therethrough such that a node between the anti-fuses is programmably coupleable to one of the supply and reference voltages for outputting an enabling signal when the latch signal closes the at least one enabling switch; and a programmable circuit comprising at least one control switch and at least two output anti-fuses coupled in series between the supply voltage and the reference voltage, the at least one control switch being coupled to the node between the enabling anti-fuses for receiving the enabling signal and being responsive thereto, the output anti-fuses being programmable to alter current flow therethrough such that a node between the anti-fuses is programmably coupleable to one of the supply and reference voltages for outputting the logic signal in the first or second logic state, respectively, when the enabling signal closes the at least one control switch.

10. The logic circuit of claim 9 wherein the enabling and control switches comprise transistors.

11. The logic circuit of claim 9 wherein the enabling circuit and the programmable circuit are provided on a single integrated circuit die.

12. An integrated circuit die comprising:

at least one enabling transistor and at least two enabling anti-fuses coupled in series between a supply voltage conductor and a reference voltage conductor, the supply voltage being associated with a first logic state and the reference voltage being associated with a second logic state, the at least one enabling transistor being connectable to receive a latch signal from external circuitry and being responsive thereto, the enabling anti-fuses being blowable to alter current flow therethrough such that a node between the anti-fuses is programmably coupleable to one of the supply and reference voltage conductors for outputting an enabling signal when the latch signal turns the at least one enabling transistor on; and at least one control transistor and at least two output anti-fuses coupled in series between the supply voltage conductor and the reference voltage conductor, the at least one control transistor being coupled to the node between the enabling anti-fuses for receiving the enabling signal and being responsive thereto, the output anti-fuses being blowable to alter current flow therethrough such that a node between the output anti-fuses is programmably coupleable to one of the supply and reference voltage conductors for outputting the logic signal in the first or second logic state, respectively, when the enabling signal closes the at least one control transistor.

13. An integrated circuit package comprising a programmable circuit for outputting a logic signal in a pre-determined logic state, the programmable circuit comprising at least two anti-fuses and a current conduit coupled in series between a supply voltage conductor and a reference voltage conductor, the supply voltage being associated with a first logic state and the reference voltage being associated with a second logic state, the anti-fuses being programmable to alter current flow therethrough such that a node between the anti-fuses is programmably coupleable to the supply voltage conductor for outputting the logic signal in the first logic state and to the reference voltage conductor for outputting the logic signal in the second logic state.

14. A redundant memory system comprising:
   a memory array including a plurality of memory cells and a plurality of redundant cells; and
   an array accessing circuit coupled to the memory array for selectively accessing memory cells in the memory array in accordance with memory addresses received from external circuitry, the array accessing circuit including a redundancy control circuit comprising:
      an enabling circuit including at least one enabling switch and at least two enabling anti-fuses coupled in series between a supply voltage and a reference voltage, the at least one enabling switch receiving a latch signal from external circuitry and being responsive thereto, the enabling anti-fuses being programmable to alter current flow therethrough such that a node between the anti-fuses is programmably coupleable to one of the supply and reference voltages for outputting an enabling signal when the latch signal closes the at least one enabling switch;
      a bank of programmable circuits for storing programmed addresses, each programmable circuit comprising at least one control switch and at least two output anti-fuses coupled in series between the supply voltage and the reference voltage, each control switch being coupled to the node between the enabling anti-fuses for receiving the enabling signal and being responsive thereto, each of the output anti-fuses being programmable to alter current flow therethrough such that a node between the output anti-fuses in each programmable circuit is programmably coupleable to one of the supply and reference voltages for outputting a bit of a programmed address when the enabling signal closes each control switch; and
      a latch circuit coupled to the programmable circuits for receiving programmed addresses therefrom, the latch circuit comparing the programmed addresses to received memory addresses and causing the array accessing circuit to selectively access a redundant cell in the memory array in lieu of accessing a memory cell when a received memory address corresponds to a programmed address.

15. A computer system comprising:
   an input device;
   an output device;
   a processor coupled to the input and output devices; and
   a memory device coupled to the processor, the memory device including a redundant memory system comprising:
      a memory array including a plurality of memory cells and a plurality of redundant cells; and
      an array accessing circuit coupled to the memory array for selectively accessing memory cells in the memory array in accordance with memory addresses received from the processor, the array accessing circuit including a redundancy control circuit comprising:
         an enabling circuit including at least one enabling switch and at least two enabling anti-fuses coupled in series between a supply voltage and a reference voltage, the at least one enabling switch receiving a latch signal from the processor and being responsive thereto, the enabling anti-fuses being programmable to alter current flow therethrough such that a node between the anti-fuses is programmably coupleable to one of the supply and reference voltages for outputting an enabling signal when the latch signal closes the at least one enabling switch;
         a bank of programmable circuits for storing programmed addresses, each programmable circuit comprising at least one control switch and at least two output anti-fuses coupled in series between the supply voltage and the reference voltage, each control switch being coupled to the node between the enabling anti-fuses for receiving the enabling signal and being responsive thereto, each of the output anti-fuses being programmable to alter current flow therethrough such that a node between the output anti-fuses in each programmable circuit is programmably coupleable to one of the supply and reference voltages for outputting a bit of a programmed address when the enabling signal closes each control switch; and
         a latch circuit coupled to the programmable circuits for receiving programmed addresses therefrom, the latch circuit comparing the programmed addresses to received memory addresses and causing the array accessing circuit to selectively access a redundant cell in the memory array in lieu of accessing a memory cell when a received memory address corresponding to the memory cell also corresponds to one of the programmed address.

16. A semiconductor wafer comprising an integrated circuit including a programmable circuit for outputting a logic signal in a pre-determined logic state, the programmable circuit comprising at least two anti-fuses and at least one current conduit coupled in series between first and second voltage conductors, the first voltage conductor being associated with a first logic state and the second voltage conductor being associated with a second logic state, the anti-fuses being programmable to alter current flow therethrough such that a node between the anti-fuses is programmably coupleable to the first voltage for outputting the logic signal in the first logic state and to the second voltage for outputting the logic signal in the second logic state.

17. A method of programming a memory device having memory cells and redundant cells to generate a programmed address in response to a latch signal for comparison to memory addresses received from external circuitry, the memory device being of the type to access one of its redundant cells in lieu of accessing one of its memory cells when a received memory address matches the programmed address, the method comprising:

providing at least two enabling anti-fuses and at least one enabling switch coupled in series between a supply voltage and a reference voltage, the at least one enabling switch being responsive to the latch signal;

programming the enabling anti-fuses to allow conduction of only one of the supply and reference voltages to an enabling node between the anti-fuses for outputting an enabling signal therefrom when the latch signal activates the at least one enabling switch;

providing at least two output anti-fuses and at least one control switch coupled in series between the supply and reference voltages for each bit in the programmed address, each control switch being responsive to the enabling signal, the output anti-fuses associated with each bit in the programmed address having an output node therebetween for outputting their associated bit; and programming the output anti-fuses associated with each bit in the programmed address to allow conduction of only one of the supply and reference voltages to their associated output node for outputting their associated bit therefrom when the enabling signal activates their associated control switch, the output nodes thereby generating the programmed address.

18. A method in a memory device for accessing a redundant cell of the memory device in lieu of accessing a memory cell of the memory device, the method comprising:

receiving a latch signal and, in response, switchably coupling a first voltage to an enabling node and outputting a corresponding enabling signal therefrom;

activating at least one control switch associated with each different bit in a programmed address in response to the enabling signal, each control switch being coupled in series with at least two anti-fuses between the first voltage and a second voltage, the second voltage being different than the first voltage, the bit associated with each control switch corresponding to one of the first and second voltages, one anti-fuse coupled in series with each control switch being pre-programmed to conduct the first or second voltage corresponding to its associated bit through itself, the other anti-fuse coupled in series with each control switch being pre-programmed to prevent conduction of any voltages through itself;

outputting each different bit in the programmed address from an output node between the anti-fuses associated with the bit and thereby outputting the programmed address;

receiving memory addresses corresponding to memory cells in the memory device;

comparing each received memory address to the programmed address; and when a received memory address and the programmed address correspond, accessing a redundant cell in the memory device in lieu of accessing the memory cell associated with the received memory address.

* * * * *

UNITED STATES PATENT AND TRADEMARK OFFICE
CERTIFICATE OF CORRECTION

PATENT NO : 5,945,840
DATED : August 31, 1999
INVENTOR(S) : Cowles et al.

It is certified that error appears in the above-identified patent and that said Letters Patent is hereby corrected as shown below:

|  | | | |
|---|---|---|---|
| | Column 1, | line 15, | delete the comma after "modules"; after "and" insert a comma; and after "specifically" insert a comma; |
| | Column 1, | line 51, | before "circuit 2" insert --logic--; |
| | Column 1, | line 67, | change "ant-fuse" to --anti-fuse--; |
| | Column 4, | line 6, | delete the comma after "circuits"; |
| | Column 4, | line 7, | delete the comma after "circuit"; |
| | Column 4, | line 28, | after "the (second occurrence) insert --output--; |
| | Column 4, | line 48, | after "the" (second occurrence) insert --output--; |
| | Column 4, | line 66, | after "each" insert --programmable--; |
| | Column 4, | line 67, | after "each" insert --programmable--; |
| | Column 5, | line 5, | change "enable circuit" to --enabling circuit--; |
| | Column 5, | line 11, | after "the" (first occurrence) insert --programmable--; |
| | Column 5, | line 33, | after "the" insert --selection--; |
| Claim 1, | Column 5, | line 52, | change "pre-determined" to --predetermined--; |
| Claim 1, | Column 5, | line 60, | change "the" (1st occurrence) to --a--; |
| Claim 1, | Column 5, | line 61, | change "the" (1st occurrence) to --a--; |
| Claim 9, | Column 6, | line 16, | change "pre-determined" to --predetermined--; |
| Claim 9, | Column 6, | line 40, | change "the" to --a--; |
| Claim 12, | Column 6, | line 52, | after "voltage" insert --conductor--; |

UNITED STATES PATENT AND TRADEMARK OFFICE
CERTIFICATE OF CORRECTION

PATENT NO  :   5,945,840
DATED      :   August 31, 1999
INVENTOR(S):   Cowles et al.

It is certified that error appears in the above-identified patent and that said Letters Patent is hereby corrected as shown below:

| | | | |
|---|---|---|---|
| Claim 12, | Column 6, | line 53, | after "voltage" insert --conductor--; |
| Claim 12, | Column 7, | line 5, | change "the" to --a--; |
| Claim 13, | Column 7, | lines 9-10, | change "pre-determined" to --predetermined--; |
| Claim 13, | Column 7, | line 19, | change "the" (1st occurrence) to --a--; |
| Claim 13, | Column 7, | line 21, | change "the" (1st occurrence) to --a--; |
| Claim 16, | Column 8, | line 49, | change "pre-determined" to --predetermined--; |
| Claim 16, | Column 8, | line 57, | after "voltage" insert --conductor--; |
| Claim 16, | Column 8, | line 57, | change "the" (2nd occurrence) to --a--; |
| Claim 16, | Column 8, | line 58, | after "voltage" insert --conductor--; |
| Claim 16, | Column 8, | line 59, | change "the" (1st occurrence) to --a--; |
| Claim 18, | Column 10, | line 8, | change "anti-fuse" to --anti-fuses--; and |
| Claim 18, | Column 10, | line 11, | change "anti-fuse" to --anti-fuses--. |

Signed and Sealed this

Second Day of January, 2001

*Attest:*

Q. TODD DICKINSON

*Attesting Officer*   *Commissioner of Patents and Trademarks*